United States Patent
Ermolov

(10) Patent No.: US 8,803,636 B2
(45) Date of Patent: Aug. 12, 2014

(54) APPARATUS AND ASSOCIATED METHODS

(75) Inventor: Vladimir Ermolov, Espoo (FI)

(73) Assignee: Nokia Corporation, Espoo (FI)

( * ) Notice: Subject to any disclaimer, the term of this patent is extended or adjusted under 35 U.S.C. 154(b) by 552 days.

(21) Appl. No.: 12/964,673

(22) Filed: Dec. 9, 2010

(65) Prior Publication Data

US 2012/0146743 A1    Jun. 14, 2012

(51) Int. Cl.
*H01P 1/18* (2006.01)

(52) U.S. Cl.
USPC ............................................. 333/156; 333/161

(58) Field of Classification Search
USPC .................. 333/156, 161, 256, 258
See application file for complete search history.

(56) References Cited

U.S. PATENT DOCUMENTS

| | | | | |
|---|---|---|---|---|
| 4,410,894 | A * | 10/1983 | Gans et al. ................ | 342/368 |
| 6,016,122 | A * | 1/2000 | Malone et al. ............ | 342/372 |
| 6,421,023 | B1 * | 7/2002 | Phelan ...................... | 343/787 |
| 6,621,377 | B2 * | 9/2003 | Osadchy et al. .......... | 333/161 |
| 6,954,118 | B2 | 10/2005 | Kozyrev et al. | |
| 7,477,116 | B2 * | 1/2009 | du Toit et al. ............ | 333/161 |
| 2002/0070900 | A1 | 6/2002 | Phelan | |
| 2004/0041664 | A1 | 3/2004 | Takasu | |
| 2006/0267709 | A1 | 11/2006 | York | |
| 2010/0021708 | A1 * | 1/2010 | Kong et al. ................ | 428/220 |
| 2010/0084697 | A1 | 4/2010 | Kopp et al. | |
| 2010/0090759 | A1 | 4/2010 | Shin et al. | |
| 2011/0095945 | A1 * | 4/2011 | Gianvittorio ............. | 342/368 |
| 2013/0113081 | A1 * | 5/2013 | Chen et al. ................ | 257/602 |

FOREIGN PATENT DOCUMENTS

| | | |
|---|---|---|
| CN | 101870466 A | 10/2010 |
| JP | 11239002 A | 8/1999 |
| JP | 2004104382 A | 4/2004 |

OTHER PUBLICATIONS

F. De Flaviis et al, "Planar microwave integrated phase-shifter design with High Purity Ferroelectric Material", IEEE Transactions on Microwave Theory and Techniques, 45, No. 6, pp. 963-969 (1997).
L. Ponomarenko et al, "Density of states and zero Landau level probed through capacitance of graphene", Phys. Rev. Lett., 105, 136801, 7 pages (2010).
S. Bae et al, "30-inch roll-based production of high-quality graphene films for flexible transparent electrodes", Nature Nanotechnology, 5, 574, 16 pages (2010).
M. Dequesnes et al, "Calculation of pull-in voltages for carbon-nanotube-based nanoelectromechanical switches", Nanotechnology, 13, pp. 120-131 (2002).
Fang, et al., "Carrier statistics and quantum capacitance of graphene sheets and ribbons", Applied Physics Letters, Aug. 27, 2007, vol. 91, pp. 92109_1-92109_3.
John, et al., "Quantum capacitance in nanoscale device modeling", Journal of Applied Physics, Nov. 1, 2004, vol. 96, No. 9, pp. 5180-5184.
Xia, et al., "Measurement of the quantum capacitance of graphene", Nature Nanotechnology, Aug. 2009, vol. 4, pp. 505-509.

* cited by examiner

*Primary Examiner* — Dean O Takaoka
*Assistant Examiner* — Alan Wong
(74) *Attorney, Agent, or Firm* — Mintz, Levin, Cohn, Ferris, Glovsky & Popeo, P.C.

(57) ABSTRACT

A voltage-tunable phase shifter comprising a conducting line and a ground electrode separated by a layer of dielectric material, the phase shifter configured to generate an electric field when a potential difference is applied between the conducting line and ground electrode, the electric field configured to change the phase of an electromagnetic signal propagating along the conducting line, wherein the ground electrode comprises graphene, and wherein the change in phase is dependent upon the strength of electric field and can be controlled by varying the potential difference between the conducting line and the ground electrode.

9 Claims, 5 Drawing Sheets

APPARATUS AND ASSOCIATED METHODS

TECHNICAL FIELD

The present disclosure relates to the field of phase shifters, associated methods and apparatus, and in particular concerns voltage-tunable phase shifters comprising a graphene ground electrode as the phase modulating element. Certain disclosed example aspects/embodiments relate to portable electronic devices, in particular, so-called hand-portable electronic devices which may be hand-held in use (although they may be placed in a cradle in use). Such hand-portable electronic devices include so-called Personal Digital Assistants (PDAs).

The portable electronic devices/apparatus according to one or more disclosed example aspects/embodiments may provide one or more audio/text/video communication functions (e.g. tele-communication, video-communication, and/or text transmission, Short Message Service (SMS)/Multimedia Message Service (MMS)/emailing functions, interactive/non-interactive viewing functions (e.g. web-browsing, navigation, TV/program viewing functions), music recording/playing functions (e.g. MP3 or other format and/or (FM/AM) radio broadcast recording/playing), downloading/sending of data functions, image capture function (e.g. using a (e.g. in-built) digital camera), and gaming functions.

BACKGROUND

Phase shifters are used in many electronic applications for altering the phase of the output signal in a transmission line. Phase shifters are a key functional component in a large number of modern communication systems, including direct satellite systems (DSS) receivers, digital cellular phones, satellite modems, and wireless local area network (LAN) modems. For example, phase shifters are used to trim the delay time of microwave signals in passive or active networks; to change the amplitude and phase of a received signal in an RF system; to control the linear phase of an amplifier provided at an transmitter/receiver of a mobile communication system; to adjust the beam scan angle of a base station antenna; and to control the phase of an output signal of a band pass filter or a duplexer. One important application of phase shifters is in digital phase-locked loops (PLL) to remove phase and/or frequency errors from received signals. Another is in phased array antennas. A phased array antenna is an antenna configuration composed of a large number of elements that emit phased signals to form a radio beam. The radio signal can be electronically steered by active manipulation of the relative phasing of the individual antenna elements. By incorporating a network of phase shifters, a phased array antenna can be pointed electronically in microseconds, without any physical realignment or movement of the antenna or its elements. Beam steering improves the carrier-to-interference ratio of the received signal by attenuating unwanted sources of interference.

Tunable phase shifters may be controlled electrically, magnetically or mechanically. Many electrical phase shifters use varactor diodes (the capacitance of which changes with voltage) or ferroelectric materials (the permittivity of which changes with electric field strength) as the phase modulating element. Tuning of the varactor capacitance or ferroelectric permittivity causes a change in phase when an RF signal passes through the phase shifter.

An issue with varactor diodes is that they consist of many components. They are expensive to make and require regular adjustment. Ferroelectric phase shifters, on the other hand, present their own problems. The integration of ferroelectric materials within an integrated circuit is challenging, high voltages are required to operate ferroelectric phase shifters, and the design of the phase shifter is complicated because the properties of ferroelectric materials are different from the properties of conventional dielectric materials used in transmission lines.

The apparatus and associated methods disclosed herein may or may not address one or more of these issues.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

SUMMARY

According to a first aspect, there is provided a voltage-tunable phase shifter comprising a conducting line and a ground electrode separated by a layer of dielectric material, the phase shifter configured to generate an electric field when a potential difference is applied between the conducting line and ground electrode, the electric field configured to change the phase of an electromagnetic signal propagating along the conducting line, wherein the ground electrode comprises graphene, and wherein the change in phase is dependent upon the strength of electric field and can be controlled by varying the potential difference between the conducting line and the ground electrode.

Throughout the specification, the term "transmission line" may be taken to cover all structures capable of carrying alternating current and electromagnetic waves with frequencies in the RF range and/or above, and includes co-axial cables, microstrips, and waveguides amongst others. A microstrip transmission line is a type of electrical transmission line that can be fabricated using printed circuit board technology, and comprises an electrically conducting strip (referred to herein as the "conducting line") separated from a ground plane by a dielectric layer (known as the "substrate"). Whilst the phase shifter described herein is based on the microstrip transmission line, the general concept could be applied to a wider class of transmission lines, including co-axial cables. In this respect, the terms "conducting line", "microstrip line" and "conducting microstrip line" may be used interchangeably throughout the specification. Similarly, the terms "transmission line" and "microstrip transmission line" may be used interchangeably throughout the specification.

The conducting line and ground electrode may comprise any electrically conductive material. In particular, the conducting line and ground electrode may comprise a metal, such as gold or copper. The dielectric material may be any dielectric exhibiting low loss, such as aluminium oxide.

The ground electrode may be formed solely from graphene, or may comprise other materials in combination with graphene. For example, the ground electrode may comprise two or more layers, and one or more of these layers may be formed solely from graphene. On the other hand, the ground electrode may comprise one or more layers comprising a graphene composite. In this latter scenario, the graphene may be doped with one or more other materials. Each of these variations may be suitable for use provided that the quantum capacitance of the ground electrode is capable of modulating the phase of the RF signal and can be controllably varied with an applied voltage.

The phase of the electromagnetic wave may be dependent upon the quantum capacitance of the ground electrode. The applied electric field may be configured to change the quantum capacitance of the ground electrode.

The conducting line and ground electrode may be configured such that the electric field is substantially perpendicular to the direction of propagation of the electromagnetic signal.

The conducting line may be a microstrip line. The electromagnetic signal may be a radio frequency signal. The electromagnetic signal may have a frequency in the THz range. In particular, the electromagnetic signal may have a frequency in the range of 30 kHz-3000 GHz. The phase shifter may be formed on top of a flexible supporting substrate. The flexible supporting substrate may be a flexible printed circuit board or a flexible region of a rigid-flex printed circuit board.

According to a further aspect, there is provided an apparatus comprising any phase shifter described herein. The apparatus may be one or more of a portable telecommunications device, a cellular network server, a cellular network base station, and a phased array antenna. The apparatus may be a module for one or more of the above.

According to a further aspect, there is provided a method for making a voltage-tunable phase shifter, the method comprising:

providing a layer of dielectric material;

providing a ground electrode comprising graphene on one surface of the dielectric material; and providing a conducting line on the opposite surface of the dielectric material to produce a voltage-tunable phase shifter comprising a conducting line and a ground electrode separated by a layer of dielectric material, the phase shifter configured to generate an electric field when a potential difference is applied between the conducting line and ground electrode, the electric field configured to change the phase of an electromagnetic signal propagating along the conducting line, wherein the ground electrode comprises graphene, and wherein the change in phase is dependent upon the strength of electric field and can be controlled by varying the potential difference between the conducting line and the ground electrode.

The ground electrode may comprise a graphene film. The graphene film may comprise one or more layers of graphene. At least one of the one or more layers of graphene may be doped with one or more other materials. The graphene film may be formed on the surface of the dielectric material by: growing the graphene film on the surface of a copper foil; adhering a thermal release layer to the graphene film; removing the copper foil from the graphene film; and pressing the graphene film against the surface of the dielectric material whilst applying sufficient heat to detach the thermal release layer from the graphene film. The graphene film may be grown using chemical vapour deposition. The copper foil may be removed using an etching process. One or more of the following steps may be performed using roll-to-roll processing: adhering the thermal release layer to the graphene film; removing the copper foil from the graphene film; and pressing the graphene film against the surface of the dielectric material whilst applying sufficient heat to detach the thermal release layer from the graphene film.

According to a further aspect, there is provided a method for making a voltage-tunable phase shifter, the method comprising:

providing a ground electrode comprising graphene;

depositing a layer of dielectric material on top of the ground electrode; and forming a conducting line on top of the dielectric material to produce a voltage-tunable phase shifter comprising a conducting line and a ground electrode separated by a layer of dielectric material, the phase shifter configured to generate an electric field when a potential difference is applied between the conducting line and ground electrode, the electric field configured to change the phase of an electromagnetic signal propagating along the conducting line, wherein the ground electrode comprises graphene, and wherein the change in phase is dependent upon the strength of electric field and can be controlled by varying the potential difference between the conducting line and the ground electrode.

The ground electrode may comprise a graphene film. The graphene film may be formed on a supporting substrate by: growing the graphene film on the surface of a copper foil; adhering a thermal release layer to the graphene film; removing the copper foil from the graphene film; and pressing the graphene film against the supporting substrate whilst applying sufficient heat to detach the thermal release layer from the graphene film. The graphene film may be grown using chemical vapour deposition. The copper foil may be removed using an etching process. One or more of the following steps may be performed using roll-to-roll processing: adhering the thermal release layer to the graphene film; removing the copper foil from the graphene film; and pressing the graphene film against the supporting substrate whilst applying sufficient heat to detach the thermal release layer from the graphene film.

According to a further aspect, there is provided a method for changing the phase of an electromagnetic signal, the method comprising:

providing a voltage-tunable phase shifter comprising a conducting line and a ground electrode separated by a layer of dielectric material, the phase shifter configured to generate an electric field when a potential difference is applied between the conducting line and ground electrode, the electric field configured to change the phase of an electromagnetic signal propagating along the conducting line, wherein the ground electrode comprises graphene, and wherein the change in phase is dependent upon the strength of electric field and can be controlled by varying the potential difference between the conducting line and the ground electrode; and applying a potential difference between the conducting line and ground electrode.

The steps of any method disclosed herein do not have to be performed in the exact order disclosed, unless explicitly stated or understood by the skilled person.

According to a further aspect, there is provided a computer program, recorded on a carrier, the computer program comprising computer code configured to perform any method described herein for making a voltage-tunable phase shifter.

According to a further aspect, there is provided a computer program, recorded on a carrier, the computer program comprising computer code configured to perform any method described herein for changing the phase of an electromagnetic signal.

The apparatus may comprise a processor configured to process the code of the computer program. The processor may be a microprocessor, including an Application Specific Integrated Circuit (ASIC).

The present disclosure includes one or more corresponding aspects, example embodiments or features in isolation or in various combinations whether or not specifically stated (including claimed) in that combination or in isolation. Corresponding means for performing one or more of the discussed functions are also within the present disclosure.

Corresponding computer programs for implementing one or more of the methods disclosed are also within the present disclosure and encompassed by one or more of the described example embodiments.

The above summary is intended to be merely exemplary and non-limiting.

BRIEF DESCRIPTION OF THE FIGURES

A description is now given, by way of example only, with reference to the accompanying drawings, in which:—

DESCRIPTION OF SPECIFIC ASPECTS/EMBODIMENTS

Figure 1:
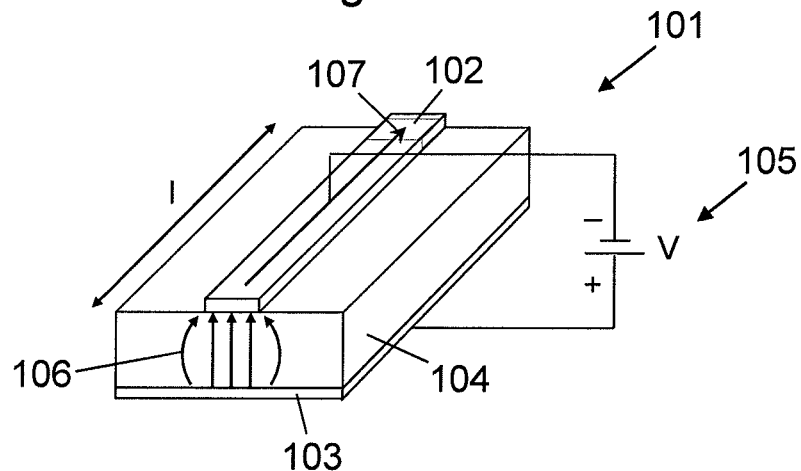
FIG. 1 shows a voltage-tunable phase shifter comprising a ferroelectric phase modulating element.

FIG. 1 shows a ferroelectric phase shifter 101. The phase shifter 101 comprises a conducting (microstrip) line 102 and a ground electrode 103, separated from one another by a tunable ferroelectric material 104. A DC voltage 105 is applied between the conducting line 102 and the ground electrode 103 to generate an electric field 106. A tunable ferroelectric material 104 is a material whose permittivity (or dielectric constant) can be varied by varying the strength of an electric field 106 to which the material is subjected. Barium-strontium titanate ($Ba_{1-x}Sr_xTiO_3$) is one such example. A change in permittivity results in a change in the velocity of propagation of an electromagnetic wave 107 guided by the transmission line, which alters the phase of the signal 107. The effect is greatest when the electric field 106 is applied perpendicular to the direction of propagation of the electromagnetic signal 107 (as shown in FIG. 1). Mathematically, the propagation constant ($\beta$) of the RF signal 107 is given by $$\beta = 2\pi/\lambda \qquad \text{Equation 1}$$

and the phase shift is given by $$\Delta\phi = 2\pi l \sqrt{\in_r(U_{bias})}/\lambda \qquad \text{Equation 2}$$

where l is the length of the microstrip line, $\lambda$ is the wavelength of the RF signal, and $\in_r(U_{bias})$ is the dielectric constant of the ferroelectric material which is a function of the bias voltage.

As mentioned in the background section, the integration of ferroelectric materials within an integrated circuit is challenging, high voltages are required to operate ferroelectric phase shifters, and the design of the phase shifter is complicated because the properties of ferroelectric materials are different from the properties of conventional dielectric materials used in transmission lines. There will now be described an apparatus and associated methods that may or may not overcome one or more of these issues.

The present disclosure utilises the quantum capacitance of graphene. The capacitance of a classical conductor is determined solely by its geometry. When charged, the electrons distribute in space in a manner that minimises their electrostatic energy. Quantum mechanics introduces extra energy terms that add new contributions to the capacitance. Since energies can simply be added, and capacitance is inversely proportional to energy, these contributions may be added in series with the classical geometric capacitance, $C_g$, to yield the total capacitance, $C_{tot}$, given by $$C_{tot}^{-1} = C_g^{-1} + C_{dos}^{-1} + C_{xc}^{-1} \qquad \text{Equation 3}$$

These extra energy terms, "$C_{dos}$" and "$C_{xc}$", are related to the electronic compressibility of the material; a fundamental physical quantity in interacting electron systems of uniform electron density which is intimately related to the strength of the inter-electron interactions. The $C_{dos}$ term is related to the kinetic energy of the electrons. Adding electrons to a conductor requires finite kinetic energy and reduces the total capacitance. On the other hand, the $C_{xc}$ term is related to the correlated motion of electrons, which generally leads to a reduction of their total electrostatic energy and increases the total capacitance. The $C_{dos}$ and $C_{xc}$ terms may be combined as a single quantum term, "$C_q$" referred to herein as the "quantum capacitance", $$C_{tot}^{-1} = C_g^{-1} + C_q^{-1} \qquad \text{Equation 4}$$

Since graphene has an atomically thin structure, it is possible to form capacitors in which the quantum capacitance dominates the electrostatics. Furthermore, since the quantum capacitance is a direct measure of the density of states at the Fermi level, it can be varied by applying a gate voltage to the capacitor. These features distinguish graphene from conventional two-dimensional systems in which the quantum capacitance is usually a small and constant contribution that is difficult to discern experimentally.

Figure 2A:
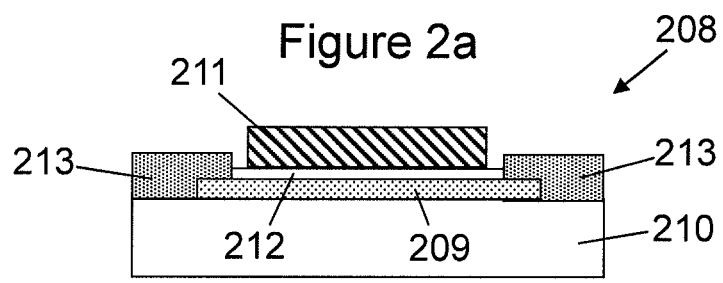
FIG. 2a shows a graphene capacitor.
Figure 2B:
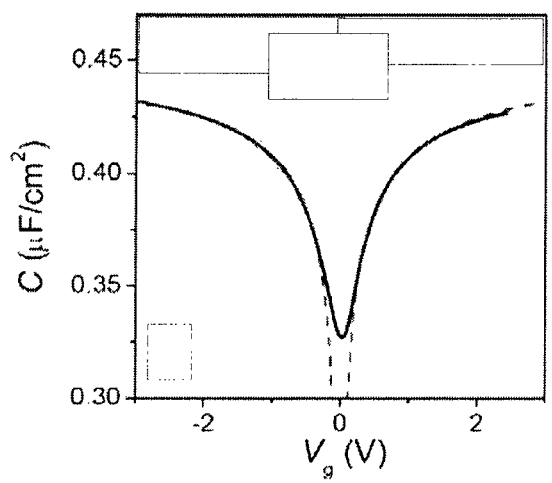
FIG. 2b shows the voltage dependence of the graphene capacitor quantum capacitance.

FIG. 2a shows the structure of a graphene capacitor 208 used in a recent study, whilst FIG. 2b shows the voltage dependence of its quantum capacitance. The capacitor 208 comprises a graphene electrode 209 on top of a silicon wafer 210, which is separated from an aluminium top gate 211 by a 10 nm layer of aluminium oxide 212. Titanium gold contacts 213 were used to route power to and from the capacitor 208.

With this structure 208, the classical geometrical capacitance, $C_g$, is governed by the aluminium oxide layer 212. As can be seen from FIG. 2b, however, the quantum capacitance associated with the graphene electrode 209 is no longer merely a correction, but can contribute up to at least 30% of the total capacitance of the structure 208. Furthermore, it is also evident from this graph that the quantum capacitance varies dramatically with changes in applied voltage.

The apparatus and associated methods described herein utilise this property of graphene to form a voltage-tunable phase shifter than is both simplistic in its construction, and is inexpensive to fabricate.

Figure 3:
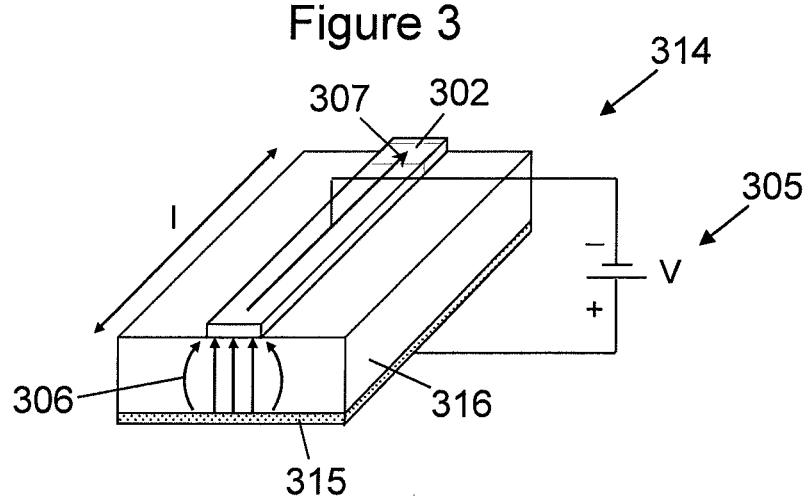
FIG. 3 shows a voltage-tunable phase shifter comprising a graphene phase modulating element.

The phase shifter 314 is illustrated schematically in FIG. 3, and comprises a conducting (e.g. microstrip) line 302 and a graphene ground electrode 315 separated by a layer of low loss dielectric material 316. As with the ferroelectric phase shifter 101 shown in FIG. 1, an electric field 306 is generated when a potential difference 305 is applied between the conducting line 302 and the ground electrode 315, and is configured to change the phase of an electromagnetic signal 307 propagating along the transmission line. The conducting line 302 and ground electrode 315 may be configured such that the electric field 306 is substantially perpendicular to the direction of propagation of the electromagnetic signal 307. The term "substantially perpendicular" may be taken, for example, to mean that the electric field between 0 to 5° or between 0 to 10° away from the normal to the direction of propagation. Whilst the change in phase is dependent upon the strength of the applied electric field 306 and can be controlled by varying the potential difference 305, as per the ferroelectric phase shifter 101, the phase change is not caused by a variation in permittivity. Instead, the phase change is caused by the change in the quantum capacitance of the graphene ground electrode 315.

Figure 4A:
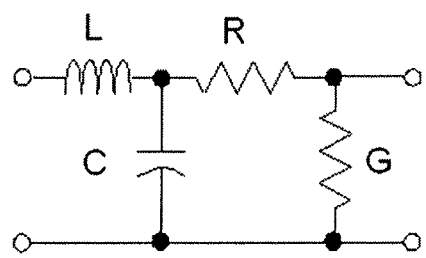
FIG. 4a shows a model of an ordinary microstrip transmission line.
Figure 4B:
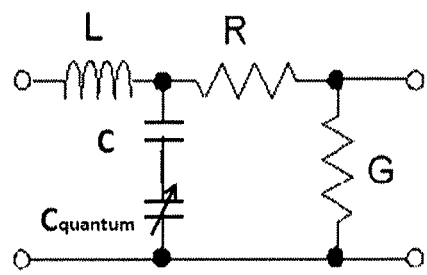
FIG. 4b shows a model of a microstrip transmission line comprising a graphene electrode.

FIG. 4a shows a model of an ordinary microwave transmission line. The model uses an infinitesimally small section of a transmission line with four elements: the series resistance (R), the series inductance (L), the shunt conductance (G), and the shunt capacitance (C), each of which are normalised per unit length. The propagation constant of a lossless transmission line is given by $$\beta = 2\pi f\sqrt{LC} \quad \text{Equation 5}$$

where f is the frequency of the RF signal. If the ground electrode is made from graphene, however, the model has to be modified to take into account the quantum capacitance, as shown in FIG. 4b. As can be seen, the quantum capacitance, $C_q$, due to the graphene electrode is connected in series with the geometrical capacitance, C, of the dielectric layer. If the electric field is perpendicular to the direction of propagation of the electromagnetic signal as shown in FIG. 3, the propagation constant depends upon the bias field, and is given by $$\beta = 2\pi\sqrt{L\frac{CC_q}{C+C_q}} \quad \text{Equation 6}$$

Figure 5:
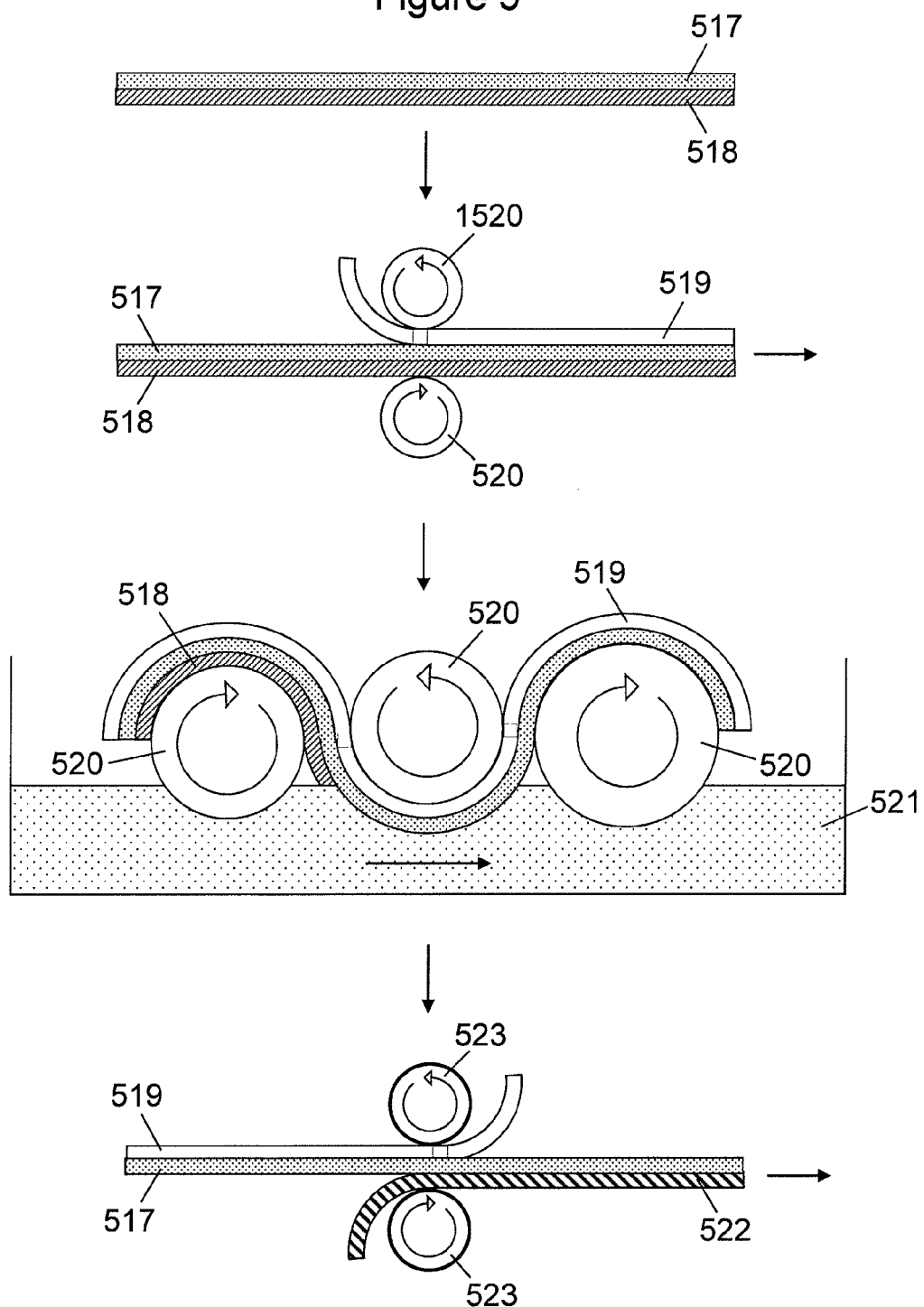
FIG. 5 shows a roll-to-roll production method for fabricating graphene films.

FIG. 5 illustrates a low cost method of fabricating graphene films which could be used to form the graphene ground electrode on top of a substrate. The dielectric layer and conducting line could then be fabricated on top of the graphene film. This technique may be particularly useful for forming the phase shifter on a flexible printed circuit board or on a flexible region of a rigid-flex printed circuit board. Rather than forming the graphene ground electrode on top of a substrate, however, the technique could also be used to form the graphene ground electrode on top of the dielectric layer itself. In this scenario, the conducting line could then be fabricated on the opposite side of the dielectric layer. It should be noted, however, that there are a number of different methods for growing and transferring graphene films, and any of these processes may be used to form the apparatus described herein.

The first step of the fabrication process is the growth of a graphene film 517 on a roll of copper foil 518 using chemical vapour deposition. To achieve this, the roll of copper foil 518 is inserted into a tubular quartz reactor and heated to 1000° C. in a flow of $H_2$ at 10 sccm and 180 mTorr. The copper foil 518 is then annealed for 30 mins at 1000° C. without changing the flow rate or pressure. A gas mixture of $CH_4$ and $H_2$ is then flowed at 1.6 Torr at a flow rate of 30 sccm and 10 sccm for 15 mins, respectively. After this, the copper foil 518 is rapidly cooled to room temperature at a rate of ~10° C./sec in a flow of $H_2$ at a pressure of 180 mTorr.

After growth of the graphene film 517, a layer of thermal release tape 519 is attached to the graphene film 517 by compressing the materials between two rollers 520 at a pressure of ~0.2 MPa. This step results in the graphene film 517 being sandwiched between the thermal release layer 519 and the copper foil 518. The next step is the removal of the copper foil 518. This is achieved by passing the material through a bath of copper etchant 521. As can be seen in FIG. 5, the material may be transported using a set of rollers 520. When using three rollers 520, the material passes through the etchant 521 once, but a greater number of rollers 520 could be used in order to expose the material to the etchant 521 more than once. Rather than using rollers 520, the etchant 521 could be sprayed onto the copper foil 518, or the material could be immersed in the etchant 521 for a predetermined period of time. Gentle agitation could be used with any of these techniques to further facilitate removal of the copper foil 518. After etching the copper foil 518, the material is rinsed with deionised water to remove any residual etchant 521. The result of this step is a graphene film 517 supported only by a layer of thermal release tape 519.

The final step in this process is the transfer of the graphene film 517 from the thermal release layer 519 to the substrate of choice 522. The substrate of choice 522 may be rigid or flexible. The graphene film 517 supported by the thermal release tape 519 is passed through a set of heated rollers 523 together with the target substrate 522 and heated to between 90-120° C. for 3-5 mins. At this temperature, the thermal energy causes the thermal release tape 519 to break free from the graphene film 517. Compression of the materials at this temperature also allows the graphene film 517 to bind to the target substrate 522. The dielectric layer 316 and conducting line 302 can then be fabricated on top of the graphene film 517 to form the voltage-tunable phase shifter 314 described herein. As mentioned above, the target substrate 522 may be the dielectric layer 316 itself (with the conducting line deposited thereon), rather than an additional supporting substrate.

Figure 6:
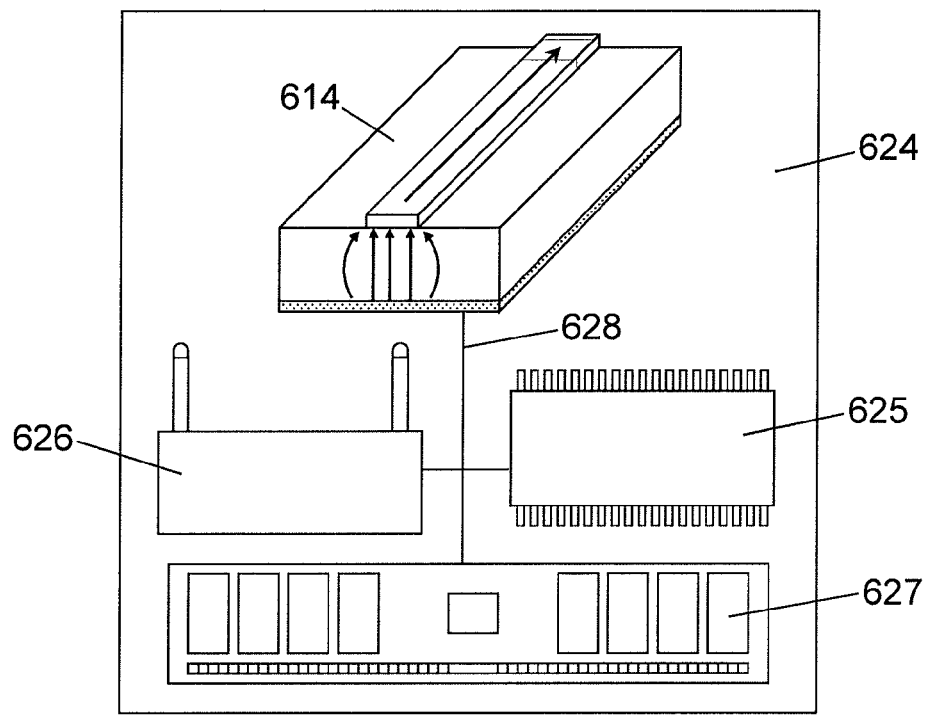
FIG. 6 shows an apparatus comprising the voltage-tunable phase shifter described herein.

FIG. 6 illustrates schematically an apparatus (or device) 624 comprising the voltage-tunable phase shifter 614 described herein. The apparatus 624 also comprises a processor 625, a transceiver 626, and a storage medium 627, which may be electrically connected to one another by a data bus 628. The apparatus 624 may be a portable electronic device (such as a portable telecommunications device), or a module for a portable electronic device. The apparatus 624 may be a phased array antenna.

The voltage-tunable phase shifter 614 is configured to change the phase of an electromagnetic signal (e.g. RF signal) propagating along the transmission line when a potential difference is applied between the conducting line and ground electrode to generate an electric field. The change in phase is dependent upon the strength of electric field, and can be controlled by varying the potential difference.

The processor 625 is configured for general operation of the apparatus 624 by providing signalling to, and receiving signalling from, the other device components to manage their operation. The processor 625 is also configured to apply a potential difference between the conducting line and ground electrode of the phase shifter 614 to generate an electric field to change the quantum capacitance of the ground electrode.

The transceiver 626 comprises one or more antenna elements, which may be configured to transmit and/or receive electromagnetic signals (e.g. RF signals) either individually, or in combination. The voltage-tunable phase shifter 614 may be configured to vary the phase of these electromagnetic signals when the potential difference between the conducting line and the ground electrode is varied.

The storage medium 627 is configured to store computer code required to operate the apparatus 624, as described with reference to FIG. 9. The storage medium 627 may also be configured to store settings for the other device components. The processor 625 may access the storage medium 627 to retrieve the component settings in order to manage the operation of the other device components. The storage medium 627 may be a temporary storage medium such as a volatile random access memory. On the other hand, the storage medium 627 may be a permanent storage medium such as a hard disk drive, a flash memory, or a non-volatile random access memory.

Figure 7:
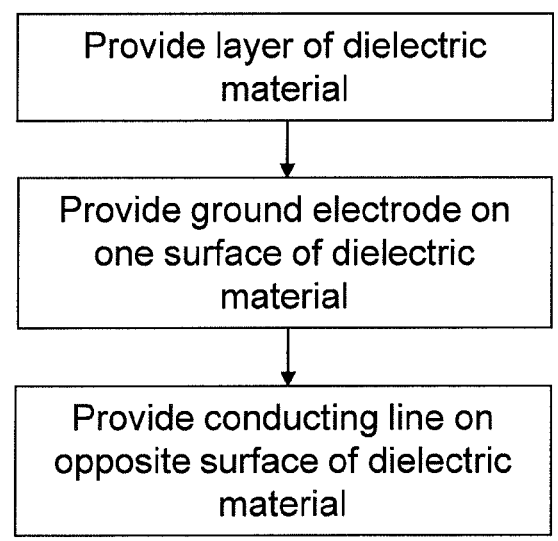
FIG. 7 shows a method of making the voltage-tunable phase shifter described herein.
Figure 8:
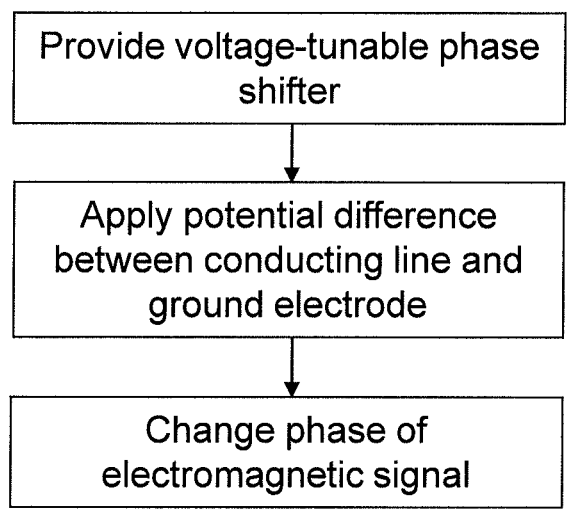
FIG. 8 shows a method of using the voltage-tunable phase shifter described herein.

The main steps of the method used to make the voltage-tunable phase shifter 614 are illustrated schematically in FIG. 7. Likewise, the main steps of the method used to operate the voltage-tunable phase shifter 614 are illustrated schematically in FIG. 8.

Figure 9:
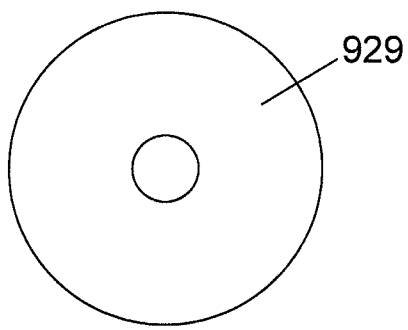
FIG. 9 shows a computer readable medium providing a program for controlling the making and/or use of the voltage-tunable phase shifter described herein.

FIG. 9 illustrates schematically a computer/processor readable medium 929 providing a computer program according to one embodiment. In this example, the computer/processor readable medium 929 is a disc such as a digital versatile disc (DVD) or a compact disc (CD). In other embodiments, the computer/processor readable medium 929 may be any medium that has been programmed in such a way as to carry out an inventive function. The computer/processor readable medium 929 may be a removable memory device such as a memory stick or memory card (SD, mini SD or micro SD).

The computer program may comprise computer code configured to perform, control or enable one or more of the following: the provision of a ground electrode comprising graphene; the deposition of a layer of dielectric material on top of the ground electrode; and the formation of a conducting line on top of the dielectric material to produce a voltage-tunable phase shifter comprising a conducting line and a ground electrode separated by a layer of dielectric material, the phase shifter configured to generate an electric field when a potential difference is applied between the conducting line and ground electrode, the electric field configured to change the phase of an electromagnetic signal propagating along the conducting line, wherein the ground electrode comprises graphene, and wherein the change in phase is dependent upon the strength of electric field and can be controlled by varying the potential difference between the conducting line and the ground electrode.

The computer program may also be configured to perform, control or enable operation of a voltage-tunable phase shifter, the voltage-tunable phase shifter comprising a conducting line and a ground electrode separated by a layer of dielectric material, the phase shifter configured to generate an electric field when a potential difference is applied between the conducting line and ground electrode, the electric field configured to change the phase of an electromagnetic signal propagating along the conducting line, wherein the ground electrode comprises graphene, and wherein the change in phase is dependent upon the strength of electric field and can be controlled by varying the potential difference between the conducting line and the ground electrode, the computer program comprising computer code configured to apply a potential difference between the conducting line and ground electrode.

Other embodiments depicted in the figures have been provided with reference numerals that correspond to similar features of earlier described embodiments. For example, feature number 1 can also correspond to numbers 101, 201, 301 etc. These numbered features may appear in the figures but may not have been directly referred to within the description of these particular embodiments. These have still been provided in the figures to aid understanding of the further embodiments, particularly in relation to the features of similar earlier described embodiments.

It will be appreciated to the skilled reader that any mentioned apparatus/device/server and/or other features of particular mentioned apparatus/device/server may be provided by apparatus arranged such that they become configured to carry out the desired operations only when enabled, e.g. switched on, or the like. In such cases, they may not necessarily have the appropriate software loaded into the active memory in the non-enabled (e.g. switched off state) and only load the appropriate software in the enabled (e.g. on state). The apparatus may comprise hardware circuitry and/or firmware. The apparatus may comprise software loaded onto memory. Such software/computer programs may be recorded on the same memory/processor/functional units and/or on one or more memories/processors/functional units.

In some embodiments, a particular mentioned apparatus/device/server may be pre-programmed with the appropriate software to carry out desired operations, and wherein the appropriate software can be enabled for use by a user downloading a "key", for example, to unlock/enable the software and its associated functionality. Advantages associated with such embodiments can include a reduced requirement to download data when further functionality is required for a device, and this can be useful in examples where a device is perceived to have sufficient capacity to store such pre-programmed software for functionality that may not be enabled by a user.

It will be appreciated that the any mentioned apparatus/circuitry/elements/processor may have other functions in addition to the mentioned functions, and that these functions may be performed by the same apparatus/circuitry/elements/processor. One or more disclosed aspects may encompass the electronic distribution of associated computer programs and computer programs (which may be source/transport encoded) recorded on an appropriate carrier (e.g. memory, signal).

It will be appreciated that any "computer" described herein can comprise a collection of one or more individual processors/processing elements that may or may not be located on the same circuit board, or the same region/position of a circuit board or even the same device. In some embodiments one or more of any mentioned processors may be distributed over a plurality of devices. The same or different processor/processing elements may perform one or more functions described herein.

It will be appreciated that the term "signalling" may refer to one or more signals transmitted as a series of transmitted and/or received signals. The series of signals may comprise one, two, three, four or even more individual signal components or distinct signals to make up said signalling. Some or all of these individual signals may be transmitted/received simultaneously, in sequence, and/or such that they temporally overlap one another.

With reference to any discussion of any mentioned computer and/or processor and memory (e.g. including ROM, CD-ROM etc), these may comprise a computer processor, Application Specific Integrated Circuit (ASIC), field-programmable gate array (FPGA), and/or other hardware components that have been programmed in such a way to carry out the inventive function.

The applicant hereby discloses in isolation each individual feature described herein and any combination of two or more such features, to the extent that such features or combinations are capable of being carried out based on the present specification as a whole, in the light of the common general knowledge of a person skilled in the art, irrespective of whether such features or combinations of features solve any problems disclosed herein, and without limitation to the scope of the claims. The applicant indicates that the disclosed aspects/embodiments may consist of any such individual feature or combination of features. In view of the foregoing description it will be evident to a person skilled in the art that various modifications may be made within the scope of the disclosure.

While there have been shown and described and pointed out fundamental novel features as applied to different embodiments thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment may be incorporated in any other disclosed or described or suggested form or embodiment as a general matter of design choice. Furthermore, in the claims means-plus-function clauses are intended to cover the structures described herein as performing the recited function and not only structural equivalents, but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed:

1. An apparatus comprising a voltage-tunable phase shifter further comprising a first conductor and a second conductor separated by a layer of dielectric material, wherein the first conductor, the second conductor, and the dielectric material are configured as a radio frequency transmission line, wherein the phase shifter is configured to generate an electric field when a voltage is applied between the first conductor and the second conductor, wherein the electric field is configured to change the phase of an electromagnetic wave propagating along the first and second conductors, wherein the second conductor comprises graphene, wherein the change in phase of the electromagnetic wave is dependent upon a quantum capacitance of the graphene second conductor, and wherein the change in phase is dependent upon the strength of the electric field and can be controlled by varying the voltage between the first conductor and the second conductor.

2. The apparatus of claim 1, wherein the first conductor and the second conductor are configured to cause the electric field to be substantially perpendicular to the direction of propagation of the electromagnetic wave.

3. The apparatus of claim 1, wherein the first conductor and the second conductor are configured as a microstrip transmission line.

4. The apparatus of claim 1, wherein the electromagnetic wave has a frequency in the range of 30 kHz-3000 GHz.

5. The apparatus of claim 1, wherein the apparatus is formed on top of a flexible supporting substrate.

6. The apparatus of claim 5, wherein the flexible supporting substrate is at least one of a flexible printed circuit board and a flexible region of a rigid-flex printed circuit board.

7. The apparatus of claim 1, wherein the apparatus is one or more of a portable telecommunications device, a module for a portable telecommunications device, a cellular network server, a cellular network base station, and a phased array antenna.

8. A method comprising:
changing a phase of an electromagnetic wave by a voltage-tunable phase shifter, wherein the voltage-tunable phase shifter comprises a first conductor and a second conductor separated by a layer of dielectric material, wherein the first conductor, the second conductor, and the dielectric material are configured as a radio frequency transmission line, wherein the phase shifter configured to generate an electric field when a voltage is applied between the first conductor and the second conductor, wherein the electric field is configured to change the phase of the electromagnetic wave propagating along the first and second conductors, wherein the second conductor comprises graphene, wherein the change in phase of the electromagnetic wave is dependent upon a quantum capacitance of the graphene second conductor, and wherein the change in phase is dependent upon the strength of the electric field and can be controlled by varying the voltage between the first conductor and the second conductor.

9. A non-transitory computer-readable medium encoded with instructions that, when executed by at least one processor, perform at least the following:
changing a phase of an electromagnetic wave by a voltage-tunable phase shifter, wherein the voltage-tunable phase shifter comprises a first conductor and a second conductor separated by a layer of dielectric material, wherein the first conductor, the second conductor, and the dielectric material are configured as a radio frequency transmission line, wherein the phase shifter s configured to generate an electric field when a voltage is applied between the first conductor and the second conductor, wherein the electric field is configured to change the phase of the electromagnetic wave propagating along the first and second conductors, wherein the second conductor comprises graphene, wherein the change in phase of the electromagnetic wave is dependent upon a quantum capacitance of the graphene second conductor, and wherein the change in phase is dependent upon the strength of the electric field and can be controlled by varying the voltage between the first conductor and second conductor.

* * * * *